United States Patent
Gravina

(10) Patent No.: US 9,907,213 B1
(45) Date of Patent: Feb. 27, 2018

(54) DATA CENTER COOLING SYSTEM HAVING ELECTRICAL POWER GENERATION

(71) Applicant: Matteo B. Gravina, Laredo, TX (US)

(72) Inventor: Matteo B. Gravina, Laredo, TX (US)

( * ) Notice: Subject to any disclaimer, the term of this patent is extended or adjusted under 35 U.S.C. 154(b) by 0 days.

(21) Appl. No.: 15/375,217

(22) Filed: Dec. 12, 2016

(51) Int. Cl.
*H05K 7/20* (2006.01)
*F01D 15/10* (2006.01)

(52) U.S. Cl.
CPC ......... *H05K 7/20745* (2013.01); *F01D 15/10* (2013.01); *H05K 7/20309* (2013.01); *H05K 7/20836* (2013.01)

(58) Field of Classification Search
CPC ........... H05K 7/20745; H05K 7/20836; H05K 7/2079; H05K 7/20827; H05K 7/1497; H05K 7/20809; H05K 7/20772; H05K 7/20736; H05K 7/20781; H05K 7/20345; H05K 7/20718; H05K 7/203; H05K 7/20145; H05K 7/20327; H05K 7/20763; H05K 1/0263; H05K 1/141; H05K 2201/10189; H05K 7/20; H05K 7/20754; H05K 7/20136; H05K 7/20709; H05K 7/20818; H05K 1/0203; H05K 2201/1056; H05K 7/20309
See application file for complete search history.

(56) References Cited

U.S. PATENT DOCUMENTS

| | | | |
|---|---|---|---|
| 6,516,954 B2 | 2/2003 | Broome | |
| 6,574,970 B2 | 6/2003 | Spinazzola et al. | |
| 6,594,148 B1 | 7/2003 | Nguyen et al. | |
| 6,672,955 B2 | 6/2004 | Charron | |
| 6,836,030 B2 | 12/2004 | Smith et al. | |
| 6,912,131 B2 | 6/2005 | Kabat | |
| 7,086,823 B2 | 8/2006 | Michaud | |
| 7,088,583 B2 | 8/2006 | Brandon et al. | |
| 7,184,267 B2 | 2/2007 | Patel | |
| 7,286,345 B2 * | 10/2007 | Casebolt | G06F 1/20 361/679.48 |
| 7,508,663 B2 | 3/2009 | Coglitore | |
| 7,534,167 B2 | 5/2009 | Day | |

(Continued)

FOREIGN PATENT DOCUMENTS

CA 2635304 A1 1/2010

OTHER PUBLICATIONS

Panduit, Panduit Corporation, "Net-SERV® Vertical Exhaust Ducts (VED)", Specification Sheet, www.panduit.com, 2012.

(Continued)

*Primary Examiner* — Adam B Dravininkas
(74) *Attorney, Agent, or Firm* — Donald J. Ersler

(57) ABSTRACT

A high performance computer cooling system having electrical power generation, which utilizes heat generated by servers to simultaneously cool the high performance computer, and generate electrical power. Taking into account the design of the high performance computer and cooling allows heat to dissipate actively or passively, which by design permits a turbine to rotate thereby generating electrical power from a generator. Using the fundamental phenomena of compressed hot air rising and cool air sinking in a cyclical approach is a force multiplier using the heat energy of the high performance computer against the natural use of elevation temperatures.

17 Claims, 14 Drawing Sheets

(56) References Cited

U.S. PATENT DOCUMENTS

| | | | |
|---|---|---|---|
| 7,752,858 B2 | 7/2010 | Johnson et al. | |
| 7,869,209 B2 | 1/2011 | Nemoz et al. | |
| 7,952,869 B2 | 5/2011 | Lewis, II et al. | |
| 7,984,613 B2 | 7/2011 | DuBois | |
| 8,040,673 B2 | 10/2011 | Krietzman | |
| 8,064,200 B1 | 11/2011 | West et al. | |
| 8,154,870 B1 | 4/2012 | Czamara et al. | |
| 8,254,120 B2 | 8/2012 | Hasse et al. | |
| 8,300,402 B2 | 10/2012 | Wei | |
| 8,331,087 B2 | 12/2012 | Wei | |
| 8,405,985 B1 | 3/2013 | Reynov et al. | |
| 8,425,287 B2 | 3/2013 | Wexler | |
| 8,456,839 B2 | 6/2013 | Shirakami et al. | |
| 8,472,181 B2 | 6/2013 | Doll | |
| 8,490,397 B2 | 7/2013 | Lehar | |
| 8,522,552 B2 | 9/2013 | Waterstripe et al. | |
| 8,522,569 B2 | 9/2013 | Avery et al. | |
| 8,640,461 B2 | 2/2014 | Thompson | |
| 8,733,103 B2 | 5/2014 | Paya Diaz | |
| 8,867,204 B1 | 10/2014 | Gardner | |
| 8,922,992 B2 | 12/2014 | Shah et al. | |
| 9,072,195 B2 | 6/2015 | Kameno et al. | |
| 9,084,369 B2 | 7/2015 | Lewis, II et al. | |
| 9,141,156 B2 | 9/2015 | Ross et al. | |
| 9,167,724 B1 | 10/2015 | Somani et al. | |
| 9,204,576 B2 | 12/2015 | Goulden et al. | |
| 9,215,831 B2 | 12/2015 | Hao et al. | |
| 2007/0074525 A1 | 4/2007 | Vinson et al. | |
| 2007/0258211 A1* | 11/2007 | Sonobe | H05K 7/20572 361/695 |
| 2008/0209931 A1* | 9/2008 | Stevens | F28D 15/0275 361/699 |
| 2009/0061755 A1 | 3/2009 | Calder et al. | |
| 2009/0205416 A1* | 8/2009 | Campbell | G01F 1/34 73/202.5 |
| 2010/0024445 A1 | 2/2010 | Cichanowicz | |
| 2010/0064714 A1* | 3/2010 | Tashiro | H05K 7/20745 62/259.2 |
| 2011/0056660 A1 | 3/2011 | Aybay et al. | |
| 2011/0096503 A1* | 4/2011 | Avery | F25B 27/02 361/701 |
| 2011/0138708 A1* | 6/2011 | Chazelle | E04H 1/06 52/173.1 |
| 2011/0154842 A1* | 6/2011 | Heydari | H05K 7/20836 62/259.2 |
| 2011/0239683 A1 | 10/2011 | Czamara et al. | |
| 2012/0075794 A1* | 3/2012 | Wei | H05K 7/1498 361/679.48 |
| 2012/0134103 A1* | 5/2012 | Tan | H05K 7/20736 361/679.46 |
| 2014/0014153 A1 | 1/2014 | Onose | |
| 2014/0133089 A1* | 5/2014 | Wiley | H05K 7/20745 361/679.46 |
| 2014/0185225 A1 | 7/2014 | Wineland | |
| 2014/0238639 A1* | 8/2014 | Ambriz | H05K 7/20745 165/57 |

OTHER PUBLICATIONS

Chatsworth Products, Inc., "Ducted Exhaust Cabinet—Managing Exhaust Airflow Beyond Hot Aisle/Cold Aisle", Cabinets: Thermal Management, White Paper, www.chatsworth.com, 2009.

"Elsevier Journal, ""Energy Conversion and Management"", Thermodynamic feasibility of harvesting data center waste heat to drivean absorption chiller, Anna Haywood, Jon Sherbeck, Patrick Phelan, Georgios Varsampoulos, Sandeep K.S.Gupta, www.elsevier.com/locate/enconman, 2012".

Chatsworth Products, Inc., "CPI Passive Cooling® Solutions: A Path to Higher Density and Lower Cost", CPI Thermal Management, White Paper, Ian Seaton, www.chatsworth.com, 2009.

Applie Methodologies, Inc., "The Case for Thermoelectrics in the Data Center", A new approach and use of an old science, AMILBAS Research, Jeffrey J. Sircuranza, 2009.

Pentair, Pentair Technical Products, "Overview & Design of Data Center Products:" www.pentairtechnicalproducts.com, 2010.

Schneider Electric, APC, "Air Distribution Architecture Options for Mission Critical Facilities", White Paper #55, Neil Rasmussen, www.apc.com, 2003.

Argonne National Laboratory, "CORAL: the Nation's Leadership Computers for Open Science from 2017 through 2022 and beyond," Susan Coghlan, ALCF Project Director, 2015.

Office of Science, DOE, "NERSC 40 Years at the Forefront 1974-2014," ASCR Facility Plans, Sudip Dosanjh, Director, 2015.

Federal Energy Management Program, U.S. Department of Energy, "Liquid Cooling v. Air Cooling Evaluation in the Maui High Performance Computing Center," Lawrence Berkeley National Laboratory Rod Mandavi, PE, LEED AP, 2014.

Office of Science, DOE, "The Opportunities and Challenges of Exascale Computing," Summary Report of the Advanced Scientific Computing Advisory Committee (ASCAC) Subcommittee, Giles, et. al., 2010.

Oak Ridge National Laboratory, Oak Ridge Leadership Computing Facility, "ORNL OLCF Facilities Plans," Jack Wells, Director of Science, HEP-ASCR Requirements Workshop, Bethesda, 2015.

Kamil, Shoaib, John Shalf, and Erich Strohmaier. "Power efficiency in high performance computing." Parallel and Distributed Processing, 2008. IPDPS 2008. IEEE International Symposium on. IEEE, 2008.

* cited by examiner

DATA CENTER COOLING SYSTEM HAVING ELECTRICAL POWER GENERATION

BACKGROUND OF THE INVENTION

1. Field of the Invention

The present invention relates generally to electrical power generation and more specifically to high performance computing cooling system having electrical power generation, which utilizes heat generated by servers to cool the high performance computer, herein known also as supercomputer and generate electrical power.

2. Discussion of the Prior Art

The advent of the computer desktop brought about opportunities and freedoms as well latitude in personal and work time. During the decade of the eighties and nineties, the exponential growth of desktops started to become a part of everyday life. Education started to use computers for teaching on hardware and software while in the business world computers started to appear to increase productivity. As computers became the norm in everyday life, they started to get more sophisticated which lead to the next step in computer technology, network connectivity.

As a result of the computer network, the logarithmic growth allow society to have freedoms and receive a better quality of life. The next step in computer technology was the interconnection of networks; as a result, the internet came into play. Now with the internet, networks could connect via new software and hardware technologies. The next step brought upon the spread of the Internet was the data center, which nowadays is the where most of the information and data that is the internet resides. Broadband, Wi-Fi and cellular technology now allows mobile users to move about and request data from these data centers, which in kind has led to an exponential growth of data centers all over the world. Due to the exponential growth in size, one aspect, which has contributed to a major problem is the use of energy for cooling large arrays of rack servers. Although problems with security, location, and size are a major factor, companies have tried to promote consolidating of solutions to their users, as a way to provide a green data center. Methods for green cooling of data centers have included the use of design, development, deploying, location and natural cooling. The data center of today still has the fundamental task of targeting the lowest power usage effectiveness in their business model.

A fundamental inability of the grouping of servers in a rack enclosure is the dismal approach of force fanning in order to expel heat energy from within the server rack. The approach of placing multiple servers in series in a horizontal plane culminates in adding additional fans on the server rack enclosure and cooling apparatuses providing the force cooling. This fundamental approach adds to the amount of energy required, not only because heat is dissipated in the horizontal plane, which is counterintuitive to the natural phenomena of heated air to move naturally up.

Yet another approach to removal of heat accumulated by a few hundred to thousands of servers is the use of green energy. This approach takes into effect by using the natural thermal conditions of air and water in certain geographical locations. This approach takes into account the seasonal times, whereas the cold air of the winter increases the efficiency by naturally cooling a supercomputer. In addition, use of hydropower as a means of using the power derived as a fundamental approach of using green energy of hydropower as an acceptable approach. Although, both approaches are viable, they neglect to take into account the use of cool air during seasons only. In addition, the use of hydropower is viable as long as the power is continuous, although due to climate changes or droughts not all locations are able to use hydropower on a twenty-four hour a day, three hundred sixty five days of the year for years onward.

Recently another approach of cooling supercomputers, is dissipating the heat accumulated by hundreds to thousands of servers in supercomputers is the use of immersion cooling. Although, not a novel approach the immersion of electronic motherboard servers and related equipment and dipping them in a liquid solution does alleviates the heat from accumulating at the sources, it has to take into account that not all servers are made alike specifically with the materials of all electronic components. Other fundamental shortcomings of immersion cooling is the limitation to using disk drives whereby a cooling liquid solution could be catastrophic if the particular hard disk at a particular time being use is open. Another fundamental hurdle is the movement physically of servers and racks from use for maintenance or malfunction; it is not as easy as moving the servers or components in an open-air room.

In tandem growth with data centers are also high performance computing centers, also referred as supercomputers. Virtually lock-step high performance computing centers and data centers use for the most part the same hardware and software technologies. Although the objectives and missions of data centers and high performance computing centers are apparently different, in that data centers depend more on connectivity via the World Wide Web, and the speed of supplying information. Therefore, the data centers provide information, while high performance computing rely nowadays more and more on central processing units and graphical processing units. High performance computing centers, therefore process massive datasets by parallel processing in multiple server nodes, and therefore provide model results in shortest time possible.

Consequently, there is a need to process massive amounts of datasets in high performance computing centers at the shortest amount of time possible, which also produces large amounts of heat. The advent of an objective of world governments to reach exaFLOPS performance thus create two challenges, one, the geographical consumption of electrical power which would equal large cities, and, two, the cooling of high performance computing centers.

SUMMARY OF THE INVENTION

Accordingly, besides the objects and advantages of the present invention to provide a production of energy with the heat obtained through electrical conductivity and processing by servers, is an object of the present invention to produce electricity generated by the heat accumulated by the servers and use the difference in temperature with air within the close loop system. As the heat generated by the servers in the silos, it will be use with cold air on an opposite side of the close loop. The cold air of the close loop system is obtained by the location of a condenser in an elevated location where the temperature is much colder than at the silos. The close loop system therefore will allow the cyclical movement of the air within the closed loop.

Therefore, it is an object of the present invention to provide an arrangement of at least one silo underground. The silos will allow the server racks to have a set of servers aligned vertically without server cases. The servers will permit the flow of air upward and with use of the evaporator oval design to move the heated air to the thermal vents. Hence, an advantage of the present invention allows the free movement of heated air by the servers to move freely within the server racks towards the silo encapsulation wall without the use of force fanning present in today's server farms.

Therefore, it is an object of the present invention to provide a consolidated thermal line whereby the accumulation of compressed hot air can reside under pressure. Therefore, accumulated hot air naturally flows upward through a main due to convection. A thermal energy conveyor is allocated between two bypassing valves. The purpose of the thermal energy conveyor is to expedite the amount of heat extracted when not using the thermal energy converter. In lieu of the servers reaching maximum performance and spiking in energy consumption, the thermal energy conveyor allows performance spikes without jeopardizing performance. At the other side of the cycle, two bypassing valves continue the flow of cold air without encountering resistance from the thermal energy conveyor wind turbine. The accumulated hot air rises due to convection and is then cooled by a heat exchanger at an elevation whereby the natural ambient cools the air inside of the heat exchanger.

Hence, an advantage of the present invention allows for the compressed hot air flowing naturally towards the heat exchanger to cool the compressed hot air residing inside of it. The design and elevation of the heat exchanger dissipates the heat through its design and the natural flow of air passing through its condenser plates. During performance spikes, heat exchanger fans come into play by actively extracting heat vertically. The heat exchanger eliminates the need for air mass movement through forced fanning as is the case in present day data centers, unless the heat exchanger fans are turned on when running at a high load.

Yet, it is an object of the present invention to provide cold condensed compressed air under pressure to move downward in elevation. The cold condensed compressed air under pressure is far denser than the air moving upwards before staging in the heat exchanger. The density of the cold air naturally flows downward with force as it is pushed by the air moving towards the heat exchanger and the natural order of cold air to drop downwards. The natural phenomena of fast moving cold air moves down the elevation line; therefore, it is advantages of the present invention to utilize the fast movement of the cold air to provide kinetic energy on a turbine and generator residing inside the thermal energy converter, unless the thermal energy conveyor is being utilized during optimal peak performance.

Yet, it is an object of the present invention to provide an increase in density by a pressurized line that increases the pressure of the air in the system, therefore the cold condensed compressed air moving downward causes an increase in kinetic energy.

The natural occurrence of very low temperatures at high elevation, while the accumulation of pressurize heated air in the consolidated thermal line permits the thermal energy conveyor to expedite the workload many times over, therefore force multiplying work due to the natural phenomena of the heated gaseous element to rise from above the conveyor turbine to in turn cold condensed air to subside at the opposing side of the conveyor cycle.

Furthermore, it is an object of the present invention to produce its own energy from the differential in temperature from the silos to the heat exchanger, when bypassing the thermal energy conveyor. As the amount of energy from the silos that accumulates moves through the system is accelerated due to the natural phenomena of compressed hot air to rise, and the natural effect of the heat exchanger to discharge the heat energy, force multiply the accelerated pressurized cold condensed compressed air to move downward to the thermal energy converter, it is therefore an advantage of the present invention to create electrical energy from its own source unlike prior art. It is in effect that the present invention can generate electrical power for use internally back to the servers and related electrical components, or use the electricity generated to supply the electrical power needs of a local user. The advantage of generating its own power further reduces the power usage effectiveness or the optimal performance of the supercomputer.

In so far, it is an object of the present invention to recycle the downward cold condensed compressed air and move it back to the silos. Therefore it is an advantage of the present invention to recycle the air in the system by natural means as opposed to the prior art, whereas recycled air is by means of force, unless during peak performance. The natural phenomena of compressed hot air to rise promotes a suction force thereby creating a natural force which recycles the energy in the air mass as it completes a full circle inside the semi-hermetic air line.

In so far, an object of the present invention is to reduce greenhouse gases by using heat energy byproduct to produce its own energy for the high performance computing center internal use and to export an excess amount to other places. Therefore, an advantage of the present invention is to take advantage of its own energy production from the heat energy produce and reduce the total amount of electrical energy use by the high performance computing centers in order to reduce anthropogenic human influence on the environment.

DETAILED DESCRIPTION OF THE PREFERRED EMBODIMENTS

Various aspects in detail of the present invention are shown in the following description in accordance with the present invention. In accordance with the design of high performance computers one of the biggest obstacles is to remove heat energy that accumulates with time. The present invention will show not only how to remove heat energy from a building, but also show how to use the heat with various proven anomalies towards producing power from the heat and natural occurrence of the absence of heat present in high terrestrial elevations.

Figure 1:
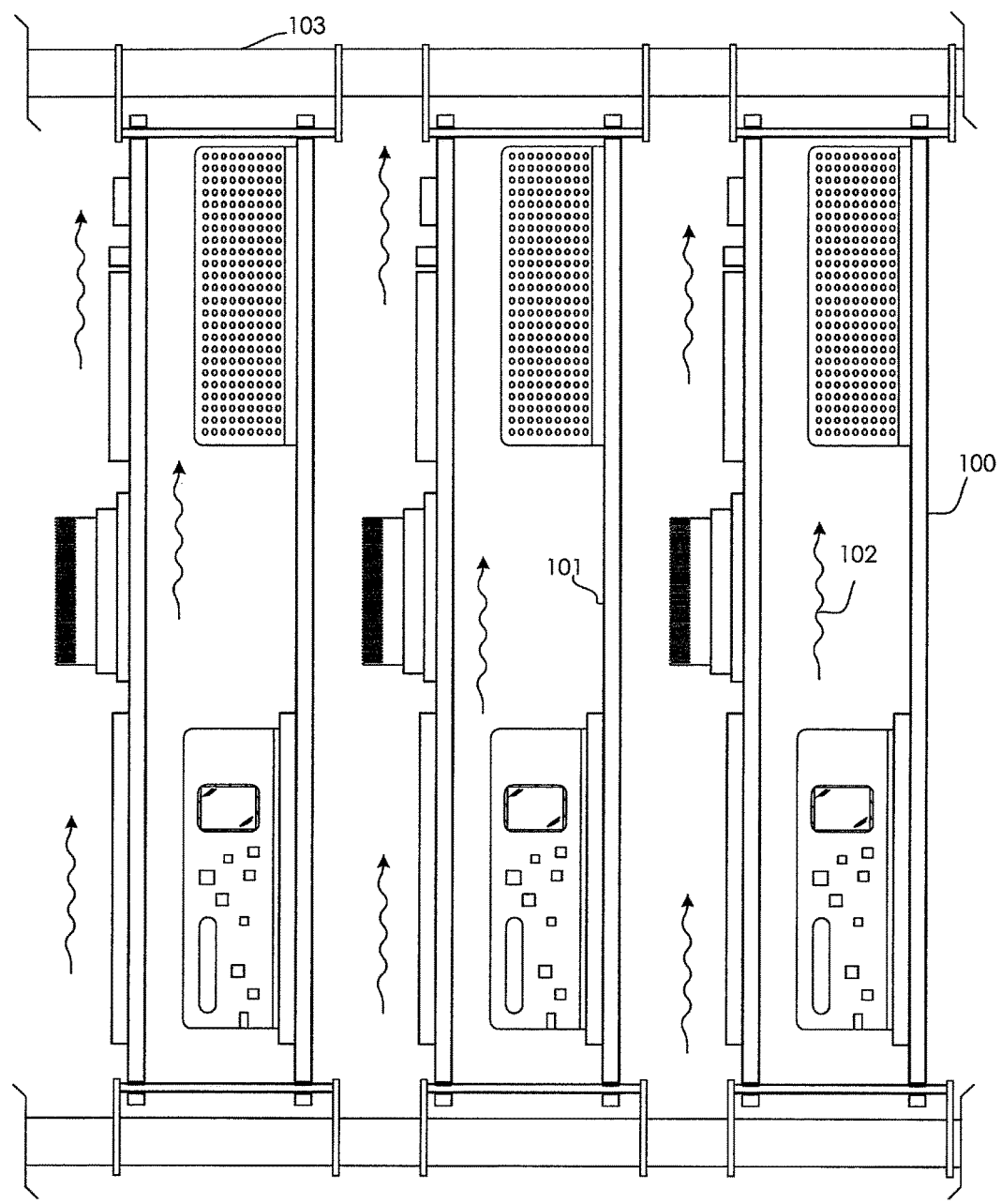
FIG. 1 is a side view of servers without a case; aligned parallel to each other, sideways on two rail rods.

FIG. 1 is an enlarged end view of a plurality of servers 100 aligned at ninety-degree angles in order to let the natural occurrence of heat to release upward. Natural flow of heat emanating from the plurality of servers 100 will create server thermals 102 that move upward. The motherboard 101 having all electronic subcomponents will conduct heat from electrical activity. Having a plurality of servers 100 in the previously mentioned configuration allows heat to move upward along the plurality of servers 100, which are retained between a pair of server rails 103.

Figure 2:
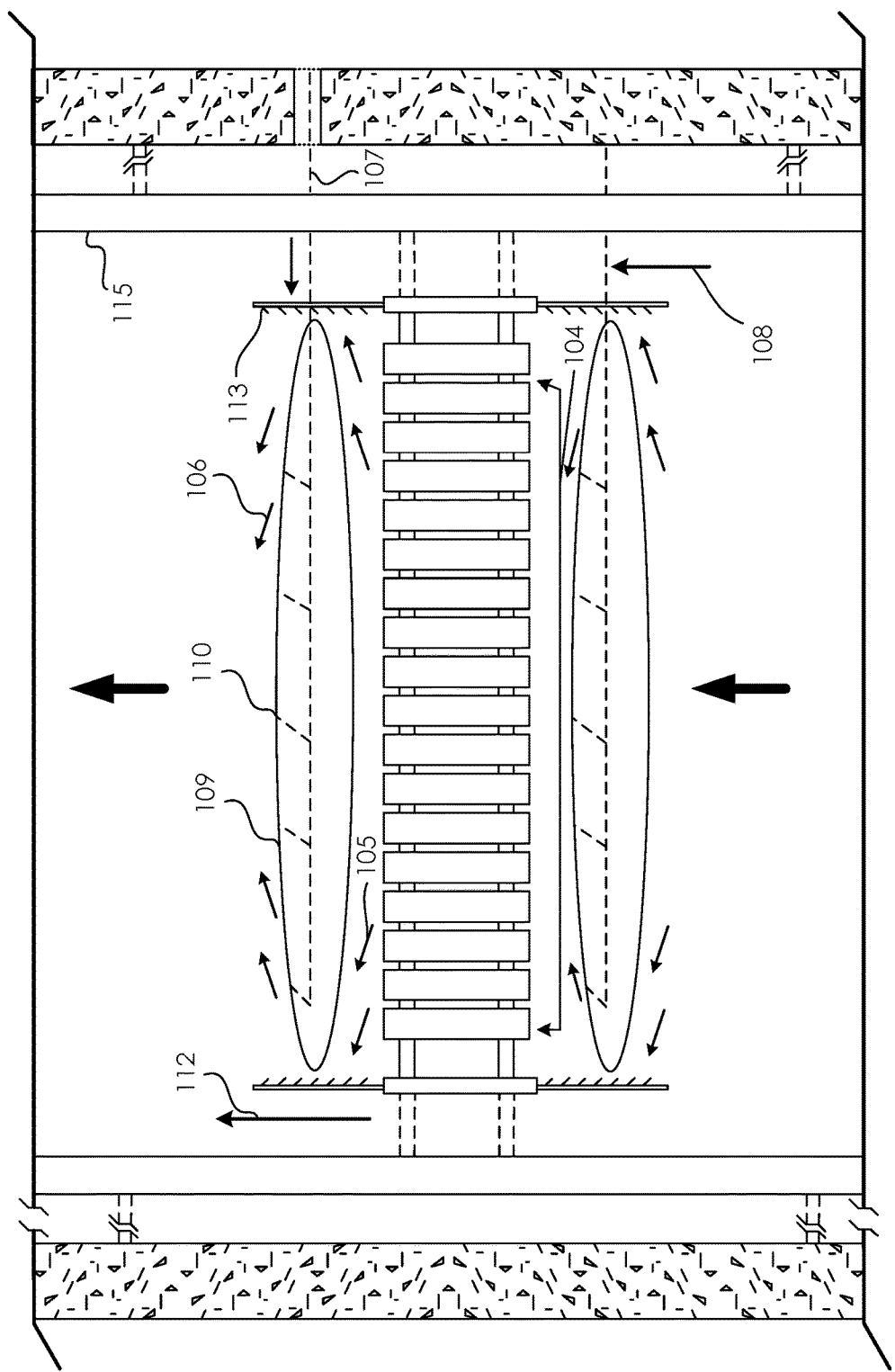
FIG. 2 is a set of servers aligned parallel to each other sideways on rail rods with evaporator coolers located above and below the set of servers.

FIG. 2 is a side view of a server rack 104 with a plurality of servers 100, which together create a pocket of heat of which with natural occurrence allows for an accumulation of server rack thermal 105 to naturally dissipate upward. A specially designed evaporator 109 with an oval bottom pushes the server rack thermal 105 to the sides onto thermal vents 113 which in turn pushes the heat outward from the server rack 104. The evaporator 109 top is equally oval as the bottom half, which in turn has several capillary openings 110 that allow cool air 106 to slip out coming from a cool air line 107. The evaporator 109 acts as a cold air dispersion device. In order to prevent the natural occurrence of heat from accumulating, the evaporator 109 resides on top of the server rack 104 and another will reside below the server rack 104 in order to introduce the cool air 106 to substitute the departing server rack thermal 105 air. The server rack thermal 105 air that departs outward through the thermal vents 113 gradually accumulates on the sides that together with more air that is heated coming from other thermal vents 113 accumulates on the sides. The left side thermal 112 and the right side thermal 108 gradually accelerate in speed upward within the silo encapsulation wall 115. This process perpetuates the movement of heated air by creating a coriolis effect within the silo encapsulation wall 115.

Figure 3:
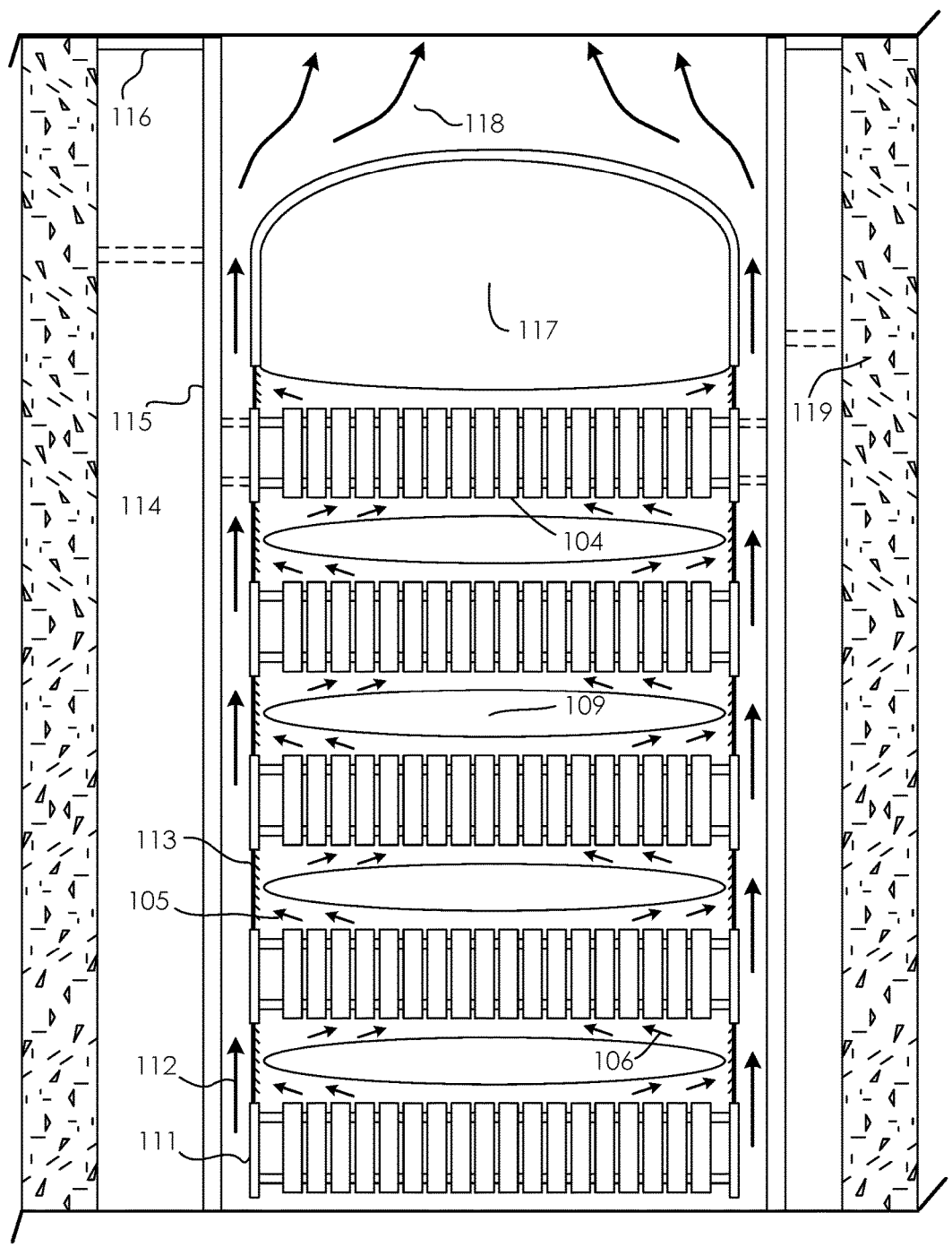
FIG. 3 a side view section of a silo exemplifying how the server rod-configured racks are aligned.

FIG. 3 is a side view of multiple server racks 104 and evaporators 109. Together aligned in that sequence in accordance to FIG. 3, which permits a strong rapid movement of venting air. In FIG. 3 coming from the bottom side, a strong wind pattern perpetually moves heated air upward. At the bottom of FIG. 3 a server rack bracket 111 sustains the server rack 104 and the thermal vents 113 of which in turn the server rack brackets 111 also serve as a deterrence from letting the server rack thermal 105 and the cool air 106 from moving sporadically. Therefore, the server rack brackets 111 keep the movement of air uniformly moving through the thermal vents 113. Having multiple server racks 104 and evaporators 109 in accordance with FIG. 3, the left side thermal 112 and the right side thermal 108 will move rapidly towards the top whereby an air spoiler 117 resides. The silo encapsulation walls 115 will prohibit the fast moving heated air from venting other than upward. On top of the air spoiler 117, compressed hot air 118 will accumulate of which then will leave onto another step in the process. The air spoiler includes a top with a convex or outwardly curving outer surface. Surrounding the silo encapsulation walls 115 is on a side is the access space 114, which is used for letting personnel to work on the servers and pertinent mechanics. The access space roof 116 is the limit between the silo encapsulation walls 115 and the silo wall 119. Keeping the whole structure within the silo encapsulation walls 115 from collapsing with its own weight are metal beams holding them in place.

Figure 4:
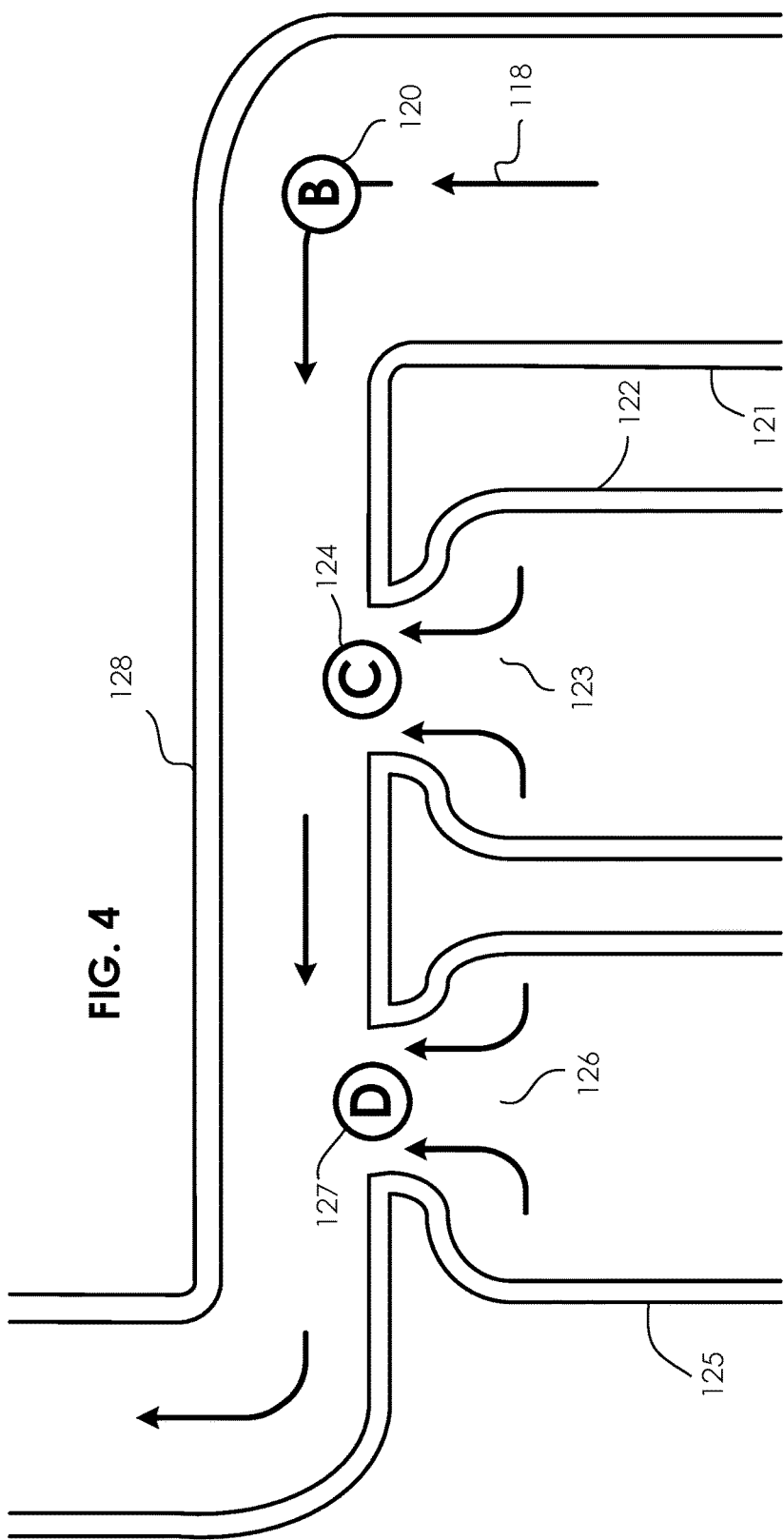
FIG. 4 shows the main line where each silo connects and sends a cumulative heated air mass towards a next stage towards a thermal line.

FIG. 4 shows another step in the process whereby the compressed hot air 118 accelerates to the top of a primary silo 121, in a multi-silo design. At the top of the primary silo 121 is the primary hot air accumulator 120, which is the location onto where the compressed hot air 118 accumulates. A secondary silo 122 with secondary silo compressed hot air 123 will also have a secondary hot air accumulator 124. At the left of FIG. 4 is a tertiary silo 125 also with tertiary silo compressed hot air 126. Together the primary accumulator 120 with the secondary hot air accumulator 124 in conjunction with a tertiary hot air accumulator 127 will create even greater compressed hot air pressure in the thermal line 128.

Figure 5:
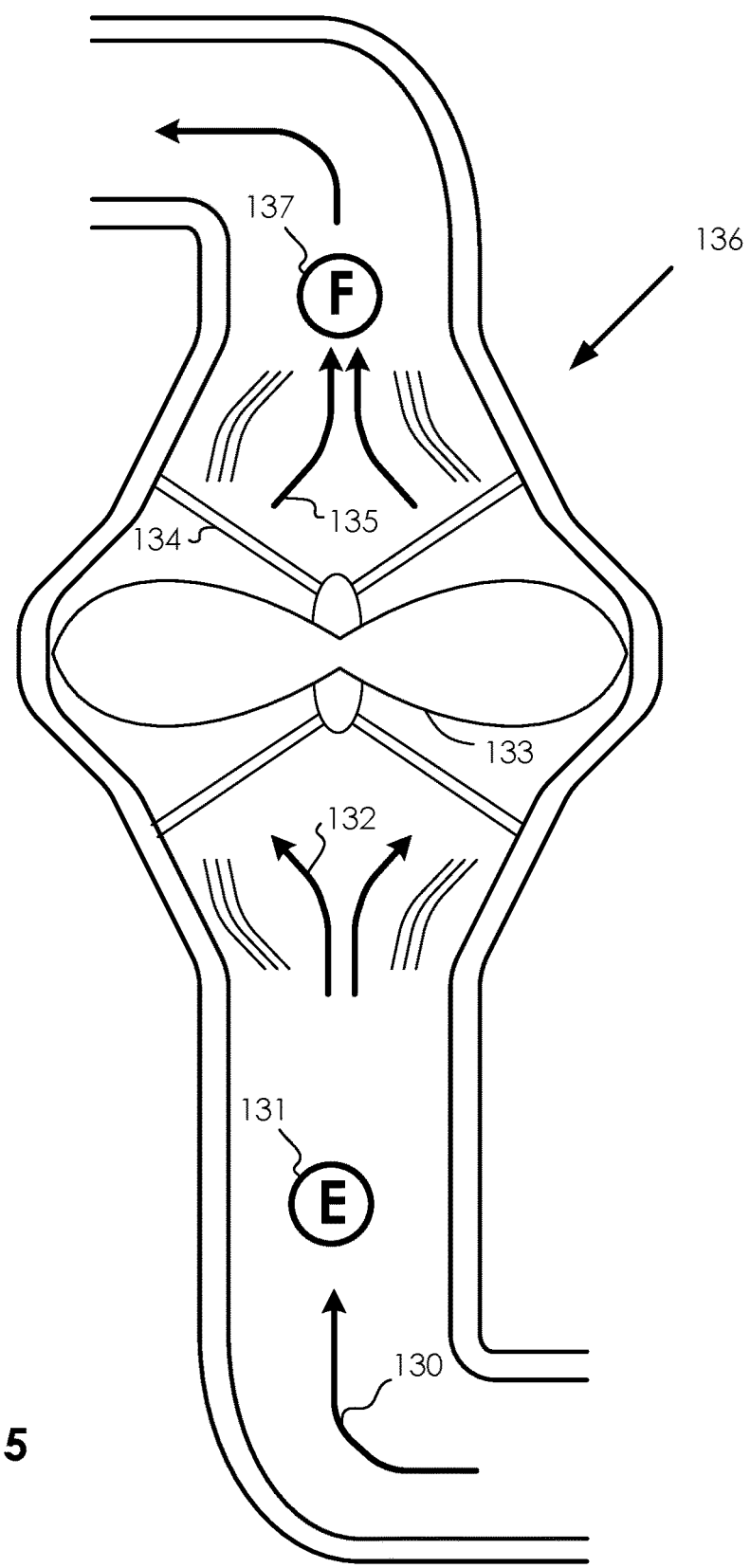
FIG. 5 is a thermal energy conveyor receiving a hot compressed air mass from a thermal line.
Figure 7:
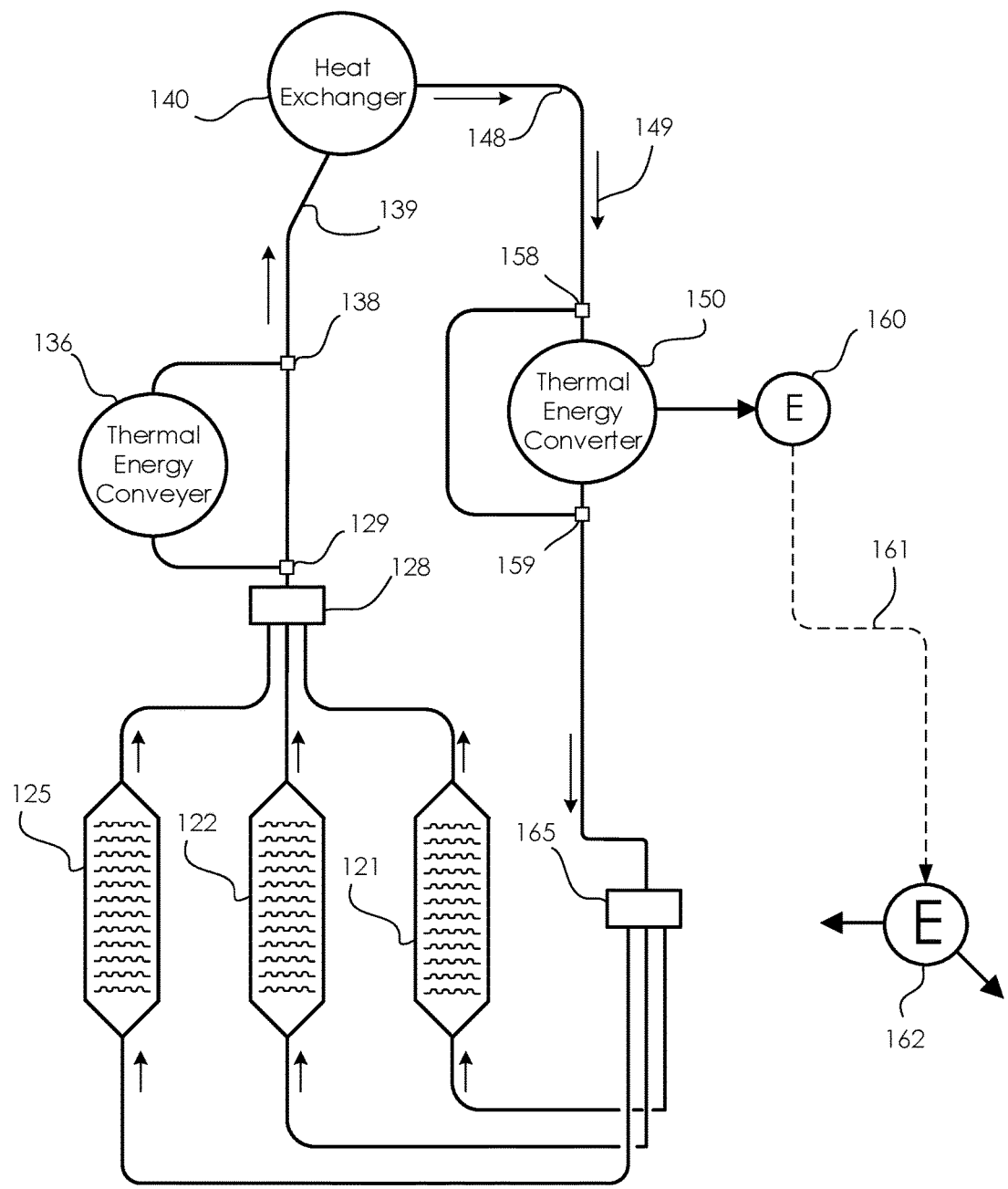
FIG. 7 is a schematic diagram of a process of the present invention.

FIG. 5 illustrates from bottom to top on how the incoming compressed hot air 118 reaches the compressed hot air vent 130 of which sends the compressed hot air accumulator 131 to the decompressed hot air coriolis point 132. The decompressed hot air coriolis point 132 creates a vortex like swirl due to the internal design. The pressurize compressed hot air 118 that passes through the coriolis point 132 in turn helps accelerate the movement of a turbine fan 133 residing inside the thermal energy conveyor 136. Turbine brackets 134 reside inside the thermal energy conveyor 136 of which has in addition a compressed hot air coriolis point 135 that is a step whereby the compressed hot air 118 that passes accelerates the vortex like swirl through the coriolis swirling point 137. With reference to FIG. 7, two valve vents are aligned with compressed hot air main 139, the first valve vent 129 and second valve vent 138, which depends, when open or close allows the flow of compressed hot air 118 to bypass or channel through the thermal energy conveyor 136.

Figure 6:
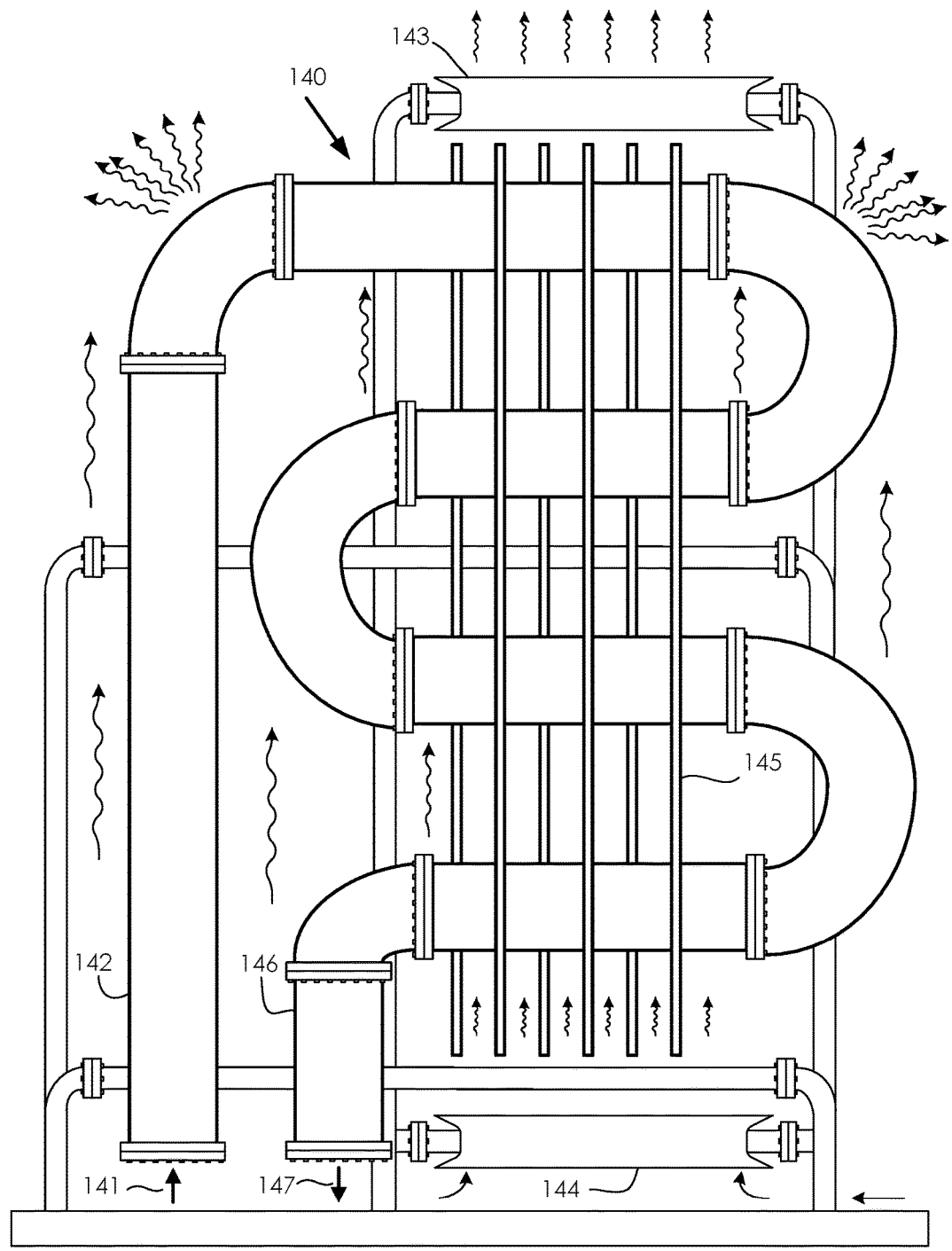
FIG. 6 is a view of an outdoor condenser with an upper heat exchanger fan and a lower heat exchanger fan.

FIG. 6 is a heat exchanger 140 residing primarily at a top of a mountain whereby cold air resides. With reference to FIG. 7, the compressed hot air main 139 sends compressed hot air 118 up to the heat exchanger 140. The natural behavior of compressed hot air 118 to move up accelerates through the compressed hot air main 139 to the heat exchanger 140. The compressed hot air condenser entry 141 receives the compressed hot air 118 of which then passes through the condenser air entry 142. As the compressed hot air 118 passes through the heat exchanger 140, the compressed hot air 118 will cool and condense, as the temperature of the compressed hot air 118 cools. As the ambient air with the natural occurrence of wind on top of a high elevation point the heat exchanger 140 is further cooled by condenser plates 145. In addition, an upper heat exchanger fan 143 and another lower heat exchanger fan 144 expedites the rates of heat loss on the heat exchanger 140. Once the compressed hot air 118 passes through the heat exchanger 140 it will turn to cold condensed compressed air 149. The cold condensed compressed air 149 will pass through the condense air main exit 146 and out through the cold air condenser exit 147.

Figure 8:
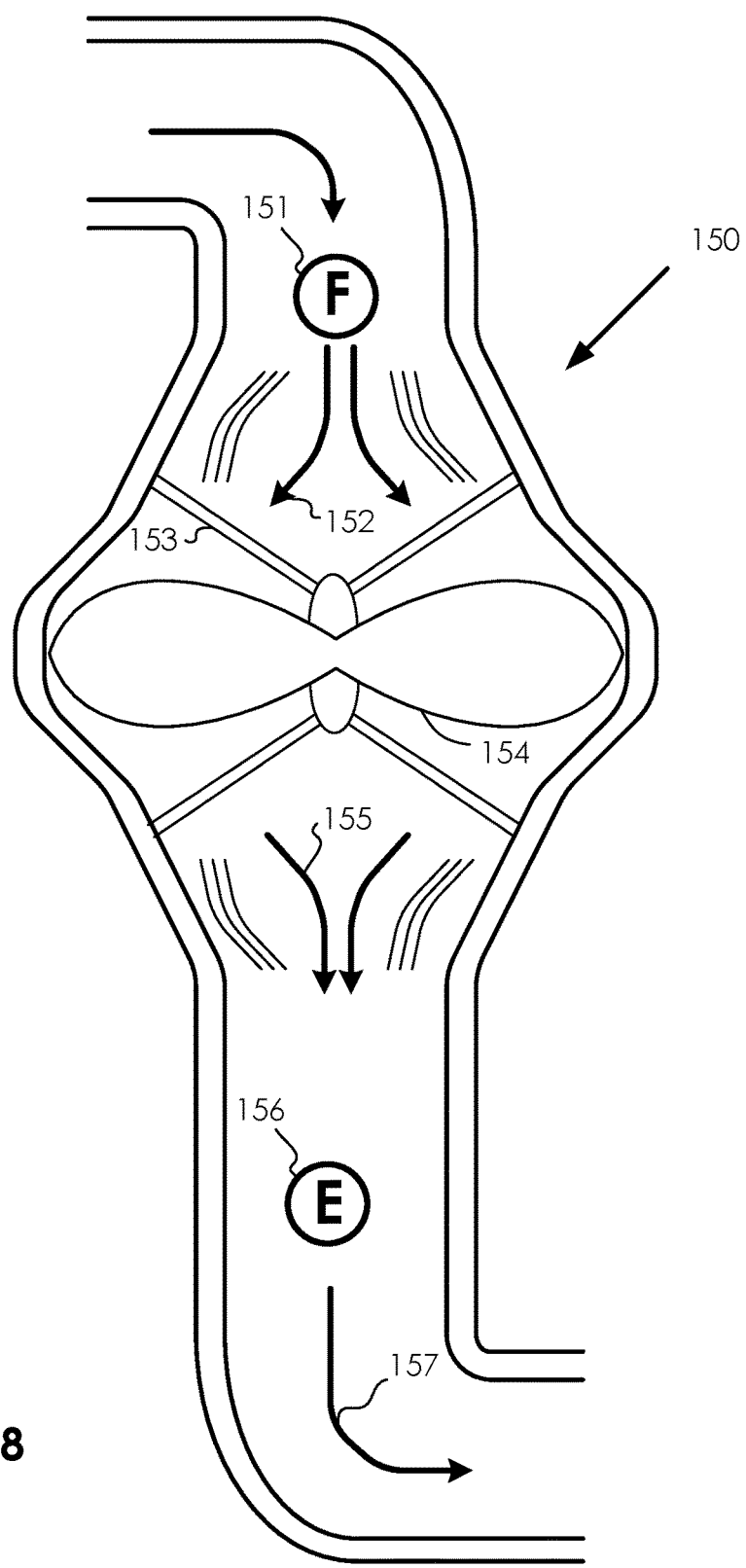
FIG. 8 is a thermal energy converter receiving a cold condensed compressed air mass from an outdoor condenser.

FIG. 7 is a schematic diagram of the invention and process. As the cold condensed compressed air 149 leaves the heat exchanger 140, the cold condensed compressed air 149 moves downward through a cold air main 148 downward to an air basement 165. Before reaching the air basement 165, the cold condensed compressed air 149 goes through a thermal energy converter 150. A third valve vent 158 together with a fourth valve vent 159 allows for movement of cold condensed compressed air 149 to bypass or channel through the thermal energy converter 150. With reference to FIG. 8, in lieu of the cold condensed compressed air 149 passing inside the thermal energy converter 150, a wind turbine 154 will create electric power 160. The electric power 160 created will then pass through transmission lines 161 then to the distribution lines 162. The distribution lines 162 allow for recycling of the electric power 160 back to the data center or high performance computing center or to the local grid.

The natural movement of cold condensed compressed air 149 moves downward perpetuated by the circulatory motion of the compressed hot air 118 to rise and the cold condensed compressed air 149 to drop downward. From the air basement 165 the cold condensed compressed air 149 moves back to the primary silo 121, the secondary silo 122, and the tertiary silo 125. At the middle of the diagram, the next step is the movement of the compressed hot air 118 as the cold condensed compressed air 149 has already heated by passing through the silos. The compressed hot air 118 passes through a thermal line 128 and onto the compressed hot air main 139 when bypassing or channeling through the thermal energy conveyor 136, through first valve vent 129 and second valve vent 138 an onto the heat exchanger 140.

FIG. 8 illustrates from top to bottom on how the incoming cold condensed compressed air 149 reaches the cold air compression spoiler 151 of which sends the cold condensed compressed air 149 to the cold air coriolis decompression point 152. The cold air coriolis decompression point 152 creates a vortex like swirl due to the internal design. The pressurize cold condensed compressed air 149 that passes through the cold air coriolis decompression point 152 in turn helps accelerate the movement of a wind turbine 154 residing inside the thermal energy converter 150. Turbine brackets 153 reside inside the thermal energy converter 150 of which has in addition a cold air coriolis compression point 155 that is a step in itself whereby the cold condensed compressed air 149 that passes accelerates the vortex like swirl through the cold air accumulation point 156 is compressed again before entering the cold air compression spoiler 157.

Figure 9:
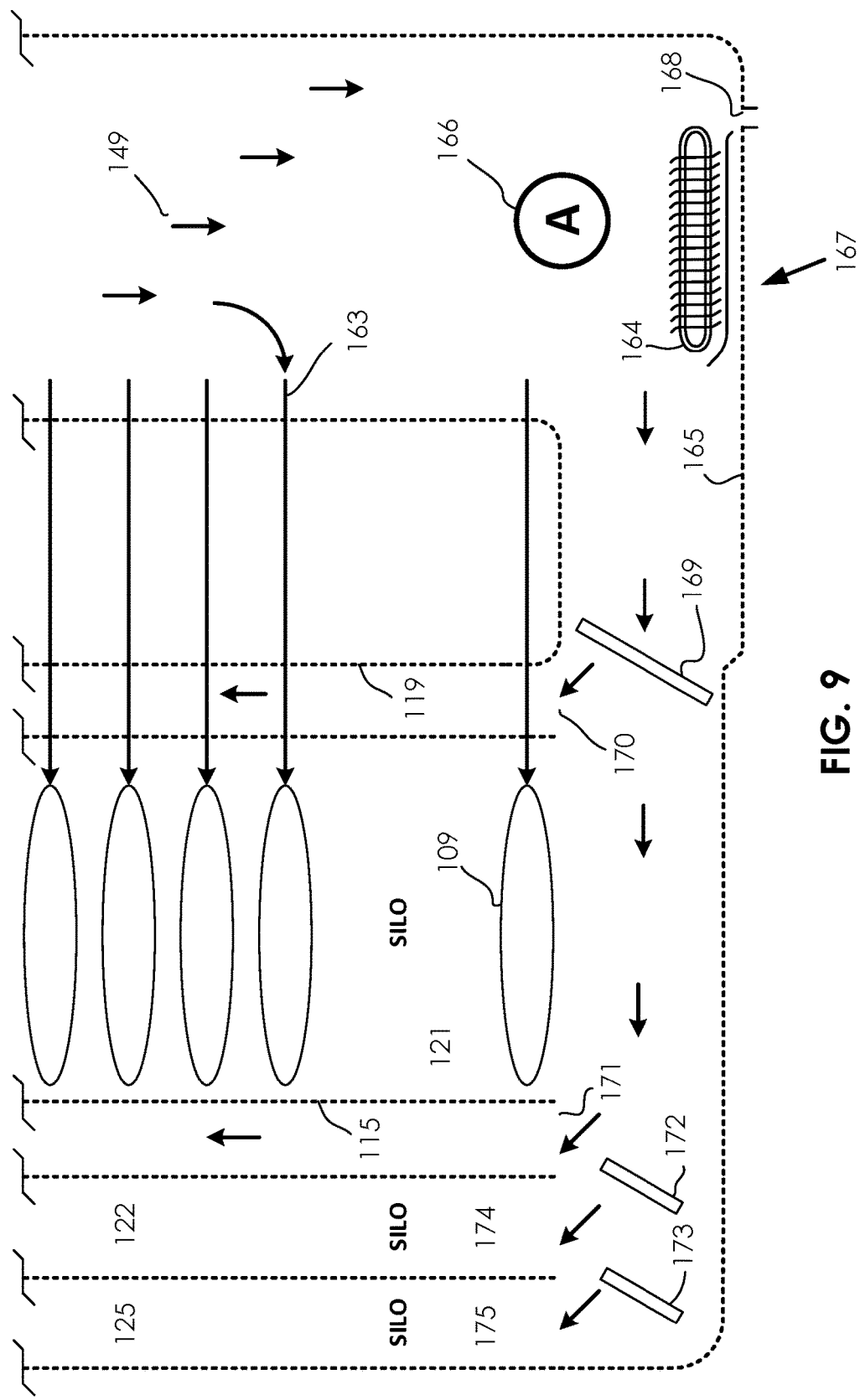
FIG. 9 is a bottom part of the present invention where cool condensed air sinks before moving towards server silos.
Figure 10:
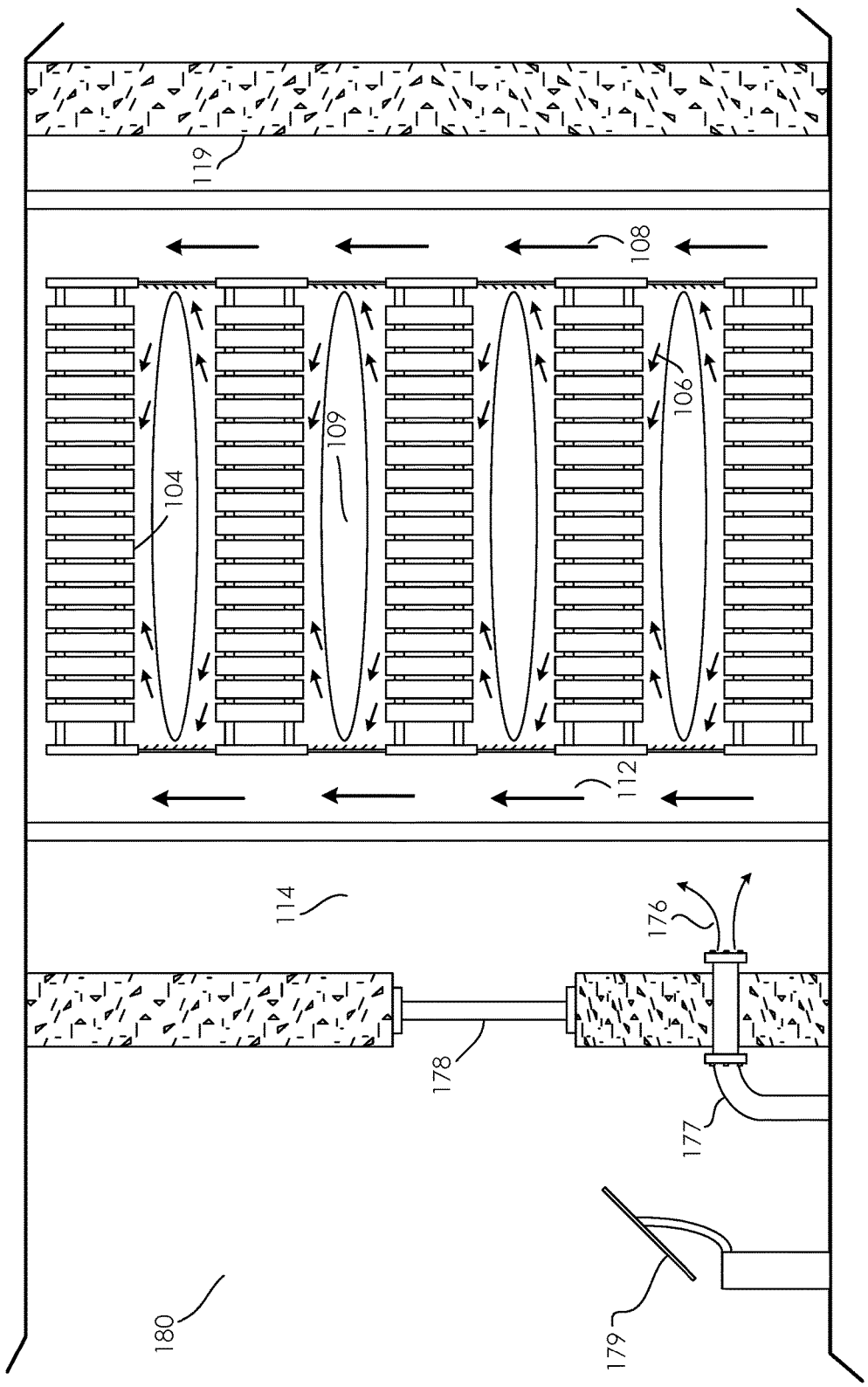
FIG. 10 is a cut-away view of a command & control room and supercomputer center silo.

FIG. 9 illustrates how part of the invention process works. As the cold condensed compressed air 149 moves towards the air basement 165, some of the cold condensed compressed air 149 moves through evaporator capillary tube lines 163, which in turn are pushed by the cold condensed compressed air 149 behind coming through the cold air main 148. With reference to FIG. 10, the same cold condensed compressed air 149 passing through the evaporator capillary tube lines 163 are pulled in by convective forces of which is further perpetuated by the left side thermal 112 and the right side thermal 108 winds. The cold air main 148 reaches the air basement 165 at the bottom end. At the air basement 165 that is the lowest depth of the cycle a cold air condensate pool 166 of cold condensed compressed air 149 resides. A humidity control device 164 resides in the basement. The purpose of the humidity control device 164 is for controlling the amount of humidity in the cold condensed compressed air 149. The air basement 165 being the deepest part of the process has a drain 168 for water condensation. The subterranean earth 167 is where the air basement 165 resides. Most of the cold condensed compressed air 149, which is not send through the evaporator capillary tube lines 163 passes onwards to the main valve 169. Passing the main valve 169 is the primary silo right entry 170 and the primary silo left entry 171, which together are at the base of the primary silo 121. The purpose of the primary silo right entry 170 and the primary silo left entry 171 is to receive the cold condensed compressed air 149. Walls that make the primary silo 121 are the silo encapsulation wall 115 which is used to sustain in part the evaporators 109 in place in addition to receive the cold condensed compressed air 149 from the evaporator capillary tube lines 163. An additional purpose of the silos encapsulation wall 115 in conjunction with the silo wall 119 is to sustain rapid cold condensed compressed air 149 at the lower level of the primary silo 121 and at the top most level of the silo compressed hot air 118 in moving expeditiously and effortlessly. At the left in FIG. 9 is the secondary silo air valve 172, which is the valve for allowing cold condensed compressed air 149 to flow inward through the secondary silo air entry 174 an onto the secondary silo 122. A tertiary silo air valve 173 allows the flow of cold condensed compressed air 149 into the tertiary silo 125 through the tertiary silo air entry 175.

Figure 11:
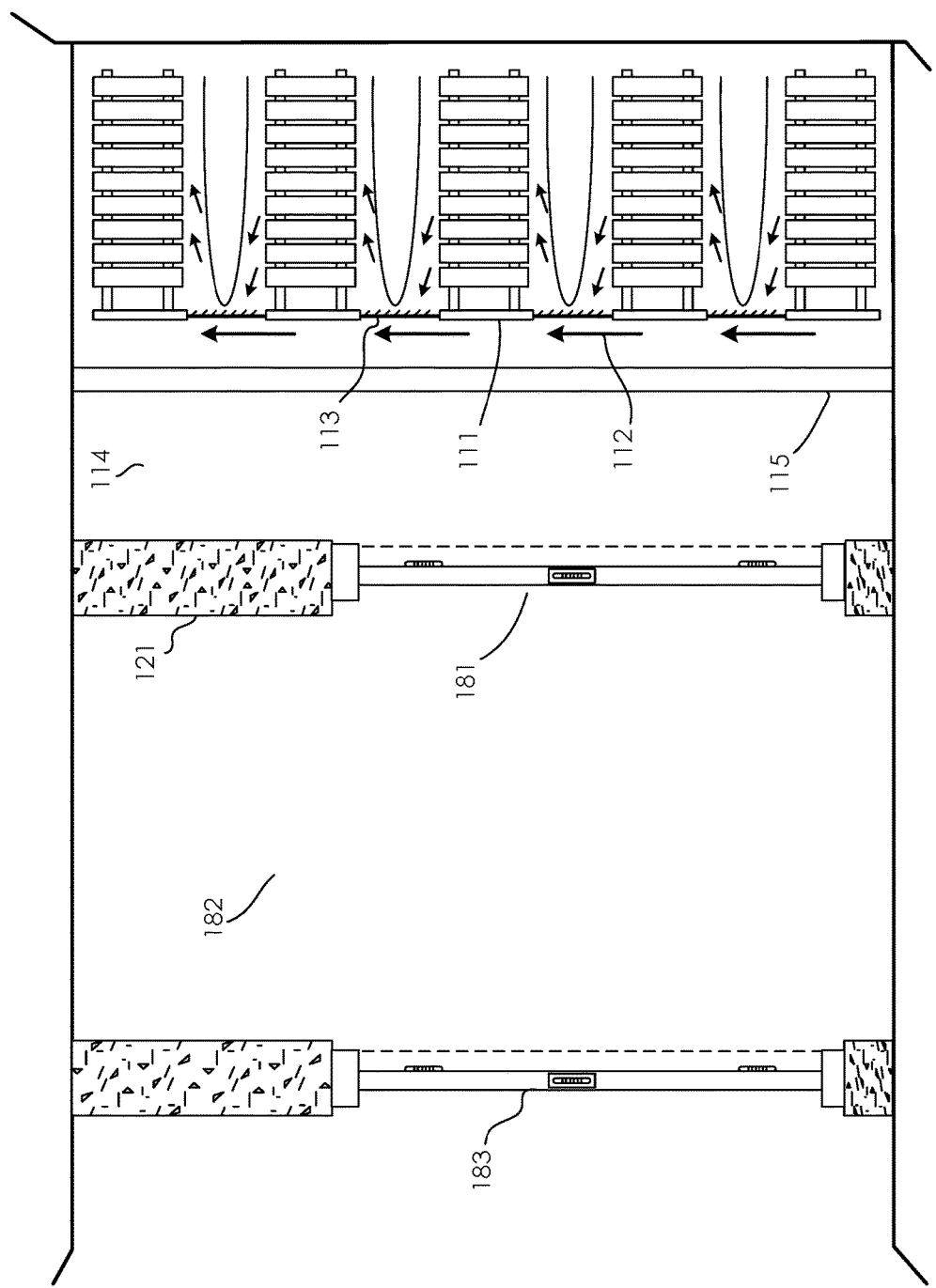
FIG. 11 is a cut-away side view of a pressure chamber and a silo.

FIG. 10 is the primary silo 121 back again complementing almost a complete cycle coming from FIG. 7. In FIG. 10 the cold condensed compressed air 149 coming from the air basement 165 is received as it passes through the server racks 104 and the air that did not came directly from the air basement 165 is receive through the evaporator 109 coming through the silo wall 119. With reference to FIG. 11, the compressed hot air 118 coming from the server racks 104 is then forwarded upward through the thermal vents 113 as the compressed hot air 118 is accelerated upward by its temperature and the left side thermal 112 and the right side thermal 108. On a left side of FIG. 10 is the access space 114, which is kept pressurized together with compressed hot air 118 and the cold condensed compressed air 149 that circulates. Air 176 is introduced by a compressed air line 177 for the purpose of increasing the amount of air inside the circulatory system. As the air 176 is compressed, the air 176 increases in energy capacity as the energy in the air 176 is able to increase in force inside the thermal line 128 as the compressed hot air 118 density is able to more forcefully through the compressed hot air main 139. An observation window 178 lets personnel in the command & control room 180 observe the primary silo 121. A command & control station 179 lets users oversee operations.

FIG. 11 shows an open view of the primary silo 121 with silo encapsulation wall 115 that controls in part, the movement of the left side thermal 112. The server rack bracket 111 together with the silo encapsulation wall 115 and the thermal vents 113 allow for rapid movement of the compressed hot air 118. Left of the access space 114 is a compression room 182 with a primary silo door 181 that allows access to the access space 114. The compression room 182 also has a compression room entry 183 for entry to the compression room 182. The purpose of the compression room 182 is to equalize the air 176 in order to allow personnel to enter the primary silo 121.

Figure 12:
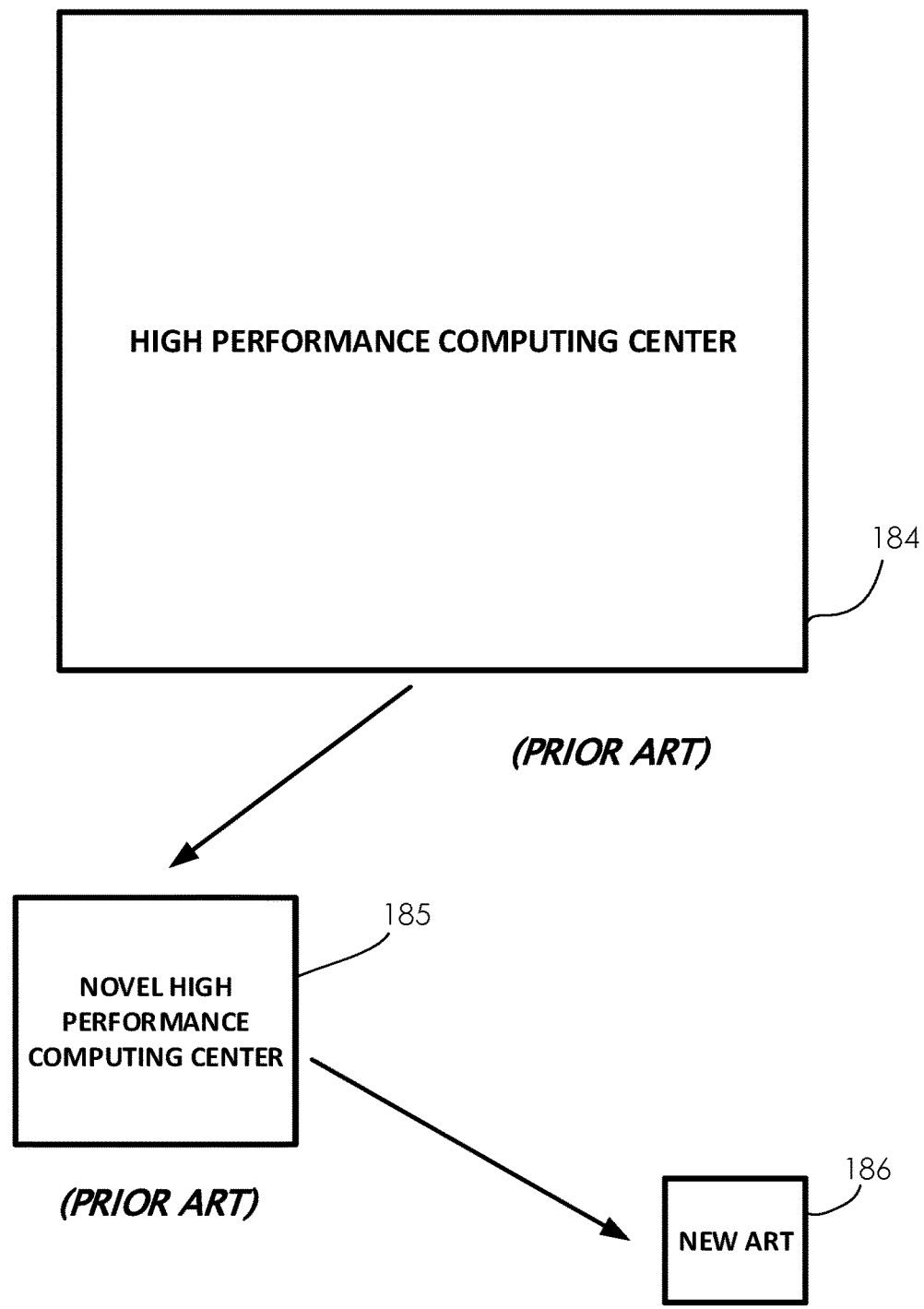
FIG. 12 block diagram of a shrinking in size comparison of a traditional high performance computing center relative to state of the art technologies coming into use and relative to the new art of the present invention.

FIG. 12 illustrates the comparison of a high performance computing center 184 area in space in comparison to a novel high performance computing center 185 which is smaller in area due to use of state of the art technologies and processes. At the bottom of the illustration in FIG. 12 is the new art 186 as is in this invention. An illustration of a how much space is area is taken as most of the art in this invention is vertical in application.

Figure 13:
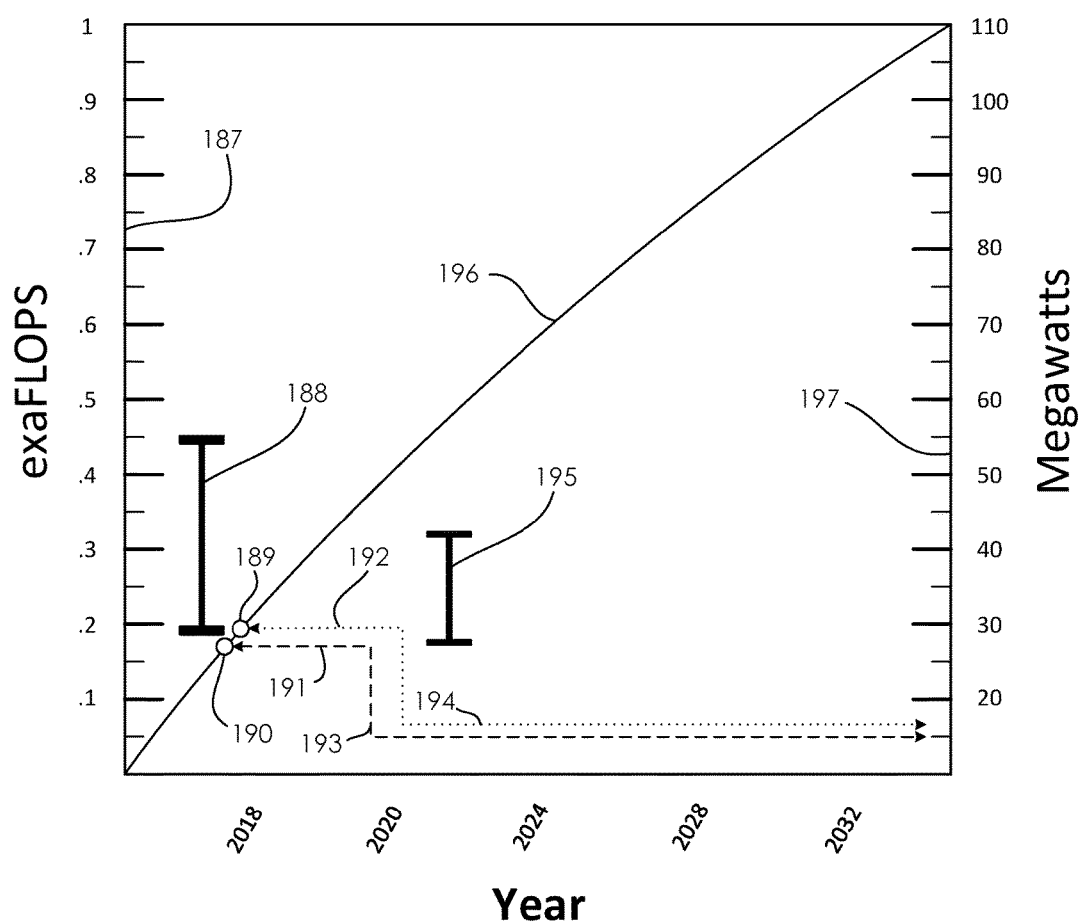
FIG. 13 is a chart depicting upcoming US Government High Performance Computers expected performance parameters and electric power consumption.

FIG. 13 illustrates a chart depicting high performance computing measurements. Coming online are two United States Government high performance computers, the Aurora Supercomputer 189 and the Summit Supercomputer 190. On the left side of FIG. 13 is a linear of measurement referred to as floating-point performance. Measured in exaFLOPS 187, the Aurora Supercomputer 189 comes in at an Aurora peak system performance 188 with an Aurora baseline 192 at about 180 to 450 petaFLOPS with a power consumption 194 of about 13 megawatts 194. As per the Summit Supercomputer 190 the Summit peak system performance 195 that comes in with a Summit baseline 191 of at about 150 to 300 petaFLOPS with a power consumption 193 of about 10 megawatts. As with both supercomputers a linear performance line 196 is evident that in coming years' higher performance is coming online, as well as power consumption 197 in megawatts is evidently increasing.

Figure 14:
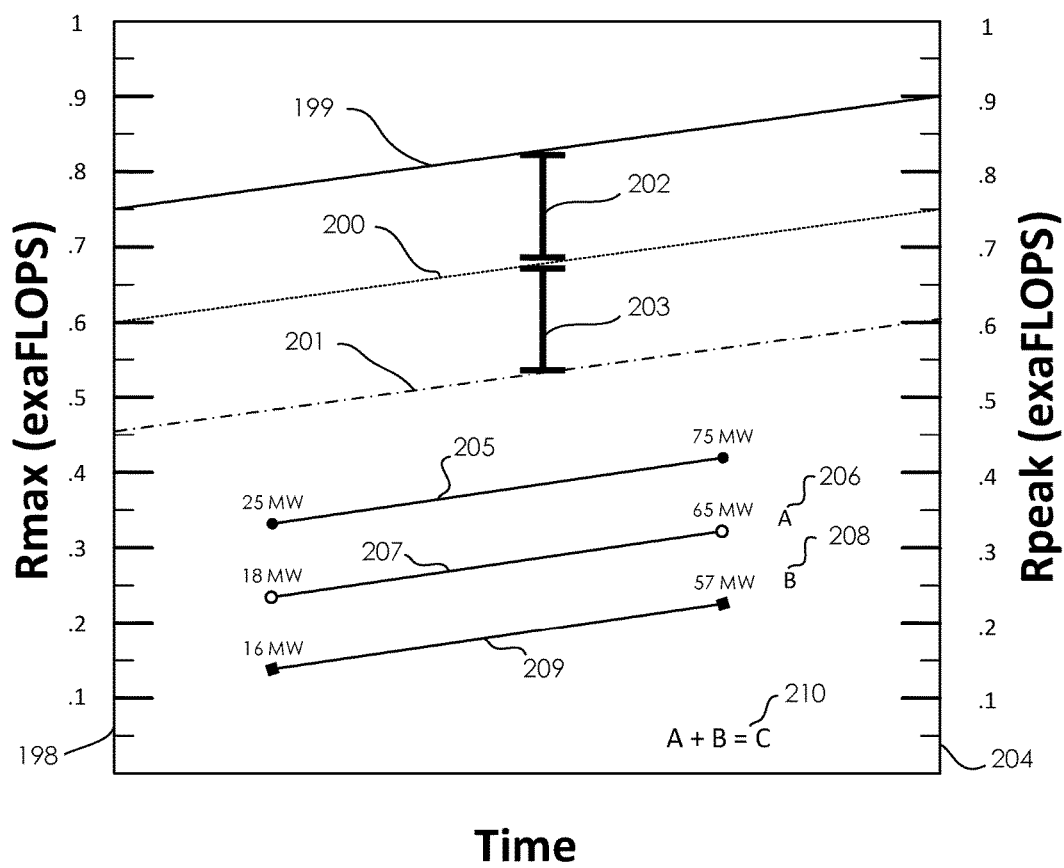
FIG. 14 is a chart depicting theoretical and real world performance workloads.

In FIG. 14 illustrates a chart with time performance of supercomputers, and how they go hand in hand with typical performance, theoretical, and usual workload. On the left side of the chart shows the Rmax 198 value at the right side is the Rpeak 204 value. While the Rmax 198 is the typical operating performance over time for a supercomputer Rpeak 204 is theoretical ability of a supercomputer to perform. Therefore, for any system the theoretical limit 199 is how much the supercomputer could perform, while the typical actual performance load 200 is much lower. Supercomputers have a daily typical load 201 which is dependent on the number of users and operations carried out. Therefore, for either data centers and supercomputers a theoretical differential load 202 is less typical then a differential workload 203 which is daily work carried out to system slow times. Eventually with time, the difference will continue to grow between the Rmax 198 and the Rpeak 204. As with performance growth, so will the power load 205 of both data centers and supercomputers. With the cooling effect 206 as a result of using the process of cooling by the invention, which will allow a power result 207. The power result 207 is the result of the amount of incoming electrical power not used in the system in lieu of the cooling effect 206. At times the system heat will be allowed to produce electrical power 160. Therefore with power management 208, the power total 209 would be equal over time with the cooling effect 206 plus the power management 208 as shown in the formula 210.

While particular embodiments of the invention have been shown and described, it will be obvious to those skilled in the art that changes and modifications may be made without departing from the invention in its broader aspects, and therefore, the aim in the appended claims is to cover all such changes and modifications as fall within the true spirit and scope of the invention.

I claim:

1. A data center cooling system comprising:
   a plurality of electronic device racks each include a plurality of electronic devices;
   a horizontal space is created between a top of a first one of said plurality of electronic device racks and a bottom of a second one of said plurality of electronic device racks;
   an evaporator is retained in said space, said evaporator acts as a cold air dispersion device;
   a first vertical space is created on a first end of said plurality of electronic device racks, a second vertical space is created on a second end of said plurality electronic device racks, wherein heated air from said plurality of electronic device racks flow into said first and second vertical spaces and upward; and
   a thermal energy conveyor expedites the amount of heat extracted from said plurality of electronic devices; and
   a heat exchanger is located vertically above a data center, said heat exchanger includes an input and an output, said heat exchanger receives heated air from said thermal energy conveyor, said heat exchanger outputs cold air cooled by an ambient source, wherein the cold air is fed into said evaporator to cool said plurality of electronic racks.

2. The data center cooling system of claim 1, further comprising:
   said thermal energy conveyor includes a turbine fan, which accelerates compressed hot air through said heat exchanger.

3. The data center cooling system of claim 1, further comprising:
   a humidity control device being located in an air basement.

4. The data center cooling system of claim 1, further comprising:
   an air spoiler is located above said a plurality of electronic device racks, said spoiler includes a top with a convex or outwardly curving outer surface.

5. The data center cooling system of claim 1, further comprising:
   said plurality of electronic device racks are retained in a silo.

6. The data center cooling system of claim 5, further comprising:
   a hot air accumulator is located at a top of said silo.

7. A data center cooling system having electrical power generation comprising:
   a plurality of electronic device racks each include a plurality of electronic devices;
   a horizontal space is created between a top of a first one of said plurality of electronic device racks and a bottom of a second one of said plurality of electronic device racks;
   an evaporator is retained in said space, said evaporator acts as a cold air dispersion device;
   a first vertical space is created on a first end of said plurality of electronic device racks, a second vertical space is created on a second end of said plurality electronic device racks, wherein heated air from said plurality of electronic device racks flow into said first and second vertical spaces and upward;
   a thermal energy conveyor expedites the amount of heat extracted from said plurality of electronic devices; and
   a heat exchanger is located vertically above a data center, said heat exchanger includes an input and an output, said heat exchanger receives heated air from said plurality of electronic device racks, said heat exchanger outputs cold air; and
   a thermal energy converter includes an electric generator which is rotated by cold air cooled by an ambient source, said electric generator outputs electrical power, wherein said thermal energy converter is bypassed when said thermal energy conveyor is in operation.

8. The data center cooling system of claim 7, further comprising:
   said thermal energy conveyor includes a turbine fan, which accelerates compressed hot air through said heat exchanger.

9. The data center cooling system of claim 7, further comprising:
   a humidity control device being located in an air basement.

10. The data center cooling system of claim 7, further comprising:
an air spoiler is located above said plurality of electronic device racks, said spoiler includes a top with a convex or outwardly curving outer surface.

11. The data center cooling system of claim 7, further comprising:
said plurality of electronic device racks are retained in a silo.

12. The data center cooling system of claim 11, further comprising:
a hot air accumulator is located at a top of said silo.

13. A data center cooling system having electrical power generation comprising:
a plurality of electronic device racks each include a plurality of electronic devices;
a horizontal space is created between a top of a first one of said plurality of electronic device racks and a bottom of a second one of said plurality of electronic device racks;
an evaporator is retained in said space, said evaporator acts as a cold air dispersion device;
a first vertical space is created on a first end of said plurality of electronic device racks, a second vertical space is created on a second end of said plurality electronic device racks, wherein heated air from said plurality of electronic device racks flow into said first and second vertical spaces and upward;
a thermal energy conveyor expedites the amount of heat extracted from said plurality of electronic devices;
a heat exchanger is located vertically above a data center, said heat exchanger includes an input and an output, said heat exchanger receives heated air from said plurality of electronic device racks, said heat exchanger outputs cold air; and
a thermal energy converter includes an electric generator which is rotated by falling cold air cooled by an ambient source, said electric generator outputs electrical power, wherein said thermal energy conveyor is bypassed during the operation of said thermal energy converter.

14. The data center cooling system of claim 13, further comprising:
said thermal energy conveyor includes a turbine fan, which accelerates compressed hot air through said heat exchanger.

15. The data center cooling system of claim 13, further comprising:
a humidity control device being located in an air basement.

16. The data center cooling system of claim 13, further comprising:
an air spoiler is located above said a plurality of electronic device racks, said spoiler includes a top with a convex or outwardly curving outer surface.

17. The data center cooling system of claim 16, further comprising:
a hot air accumulator is located at a top of a silo.

* * * * *